United States Patent
Kiser et al.

[11] Patent Number: 5,909,121
[45] Date of Patent: Jun. 1, 1999

[54] METHOD AND APPARATUS FOR SCRUBBING THE BOND PADS OF AN INTEGRATED CIRCUIT DURING WAFER SORT

[75] Inventors: David Kerry Kiser, Gilbert, Ariz.; Robert J. Hyatt, Santa Clara, Calif.

[73] Assignee: Intel Corporation, Santa Clara, Calif.

[21] Appl. No.: 08/874,821

[22] Filed: Jun. 13, 1997

Related U.S. Application Data

[62] Division of application No. 08/590,542, Jan. 24, 1996, abandoned.

[51] Int. Cl.$^6$ .................................................. G01R 1/04
[52] U.S. Cl. ............................................ 324/757; 324/765
[58] Field of Search .......................... 324/765, 754, 324/757, 758; 438/14, 18; 364/551.01, 550, 571; 702/85; 257/40, 48

[56] References Cited

U.S. PATENT DOCUMENTS

| | | | |
|---|---|---|---|
| 3,453,545 | 7/1969 | Oates | 324/757 |
| 3,628,144 | 12/1971 | Aronstein | 324/757 |
| 3,996,516 | 12/1976 | Luther | 324/72.5 |
| 4,590,422 | 5/1986 | Milligan | 324/158 |
| 4,780,836 | 10/1988 | Miyazaki et al. | 324/765 |
| 4,820,976 | 4/1989 | Brown | 324/760 |
| 5,128,612 | 7/1992 | Aton et al. | 324/754 |
| 5,369,358 | 11/1994 | Metzger et al. | 324/754 |
| 5,436,571 | 7/1995 | Karasawa | 324/765 |
| 5,773,987 | 6/1998 | Montoya | 324/757 |

*Primary Examiner*—Vinh P. Nguyen
*Attorney, Agent, or Firm*—Blakely, Sokoloff, Taylor & Zafman LLP

[57] ABSTRACT

A method and apparatus for electrically coupling the bond pads of an integrated circuit to a tester using a probe card having a biasing element supporting a plurality of tests probes. In one embodiment, the method includes the steps of placing the test probes in contact with the bond pads and providing a vibrational movement to the biasing element such that the test probes move relative to the bond pads and such that the test probes remove an electrically non-conductive material on the surface of the bond pads to establish an electrical connection between the test probes and the bond pads.

10 Claims, 11 Drawing Sheets

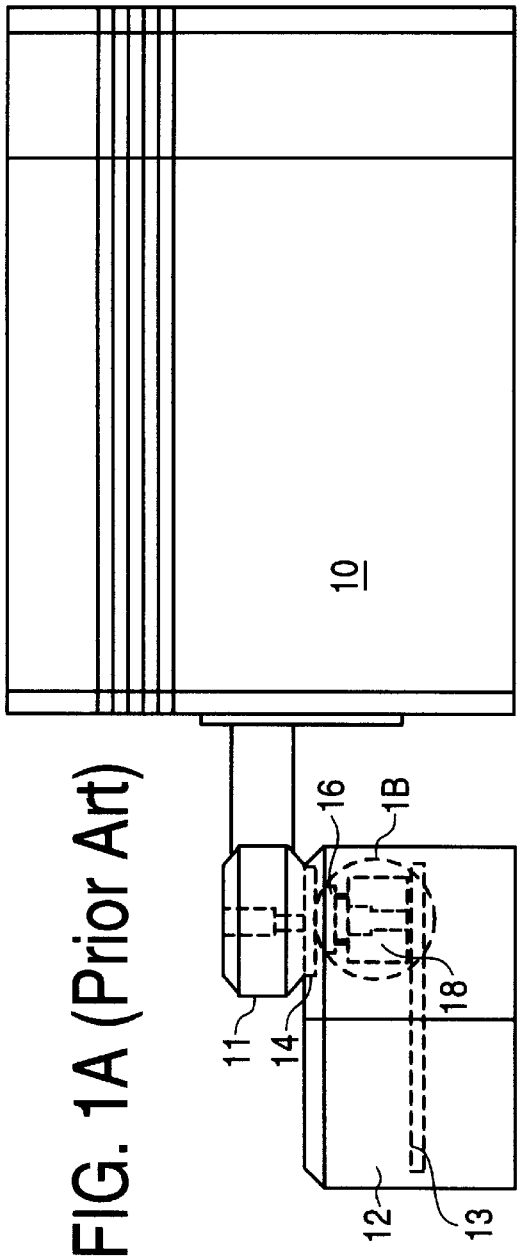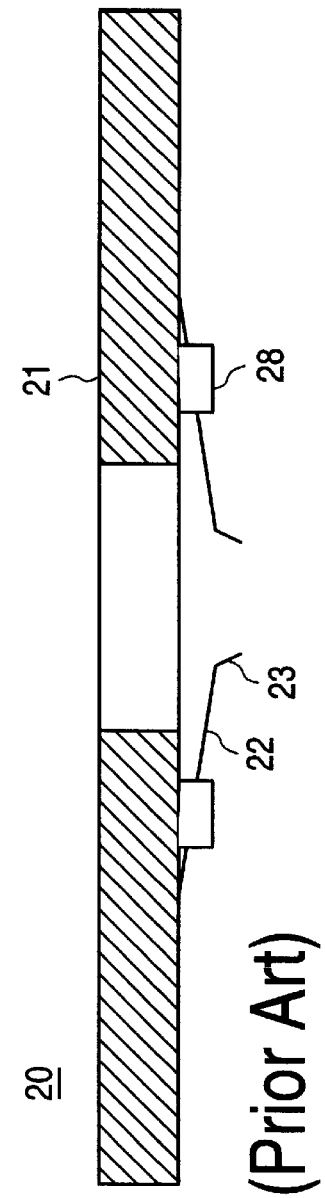

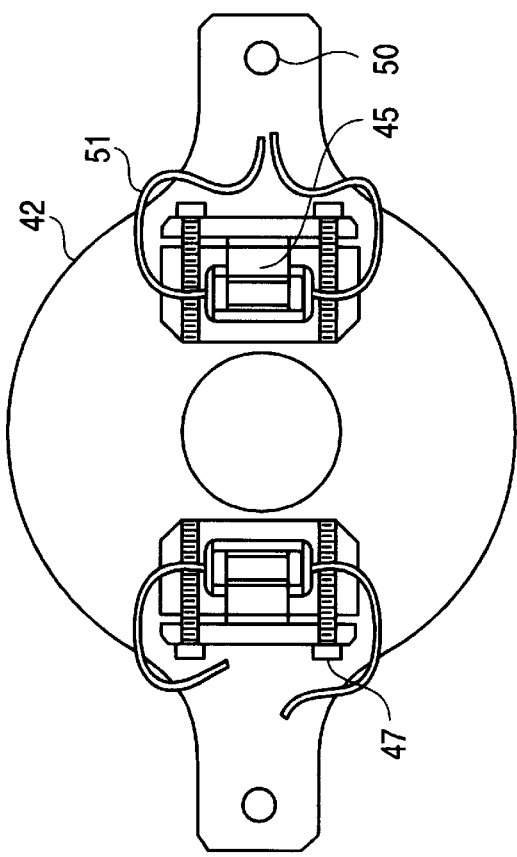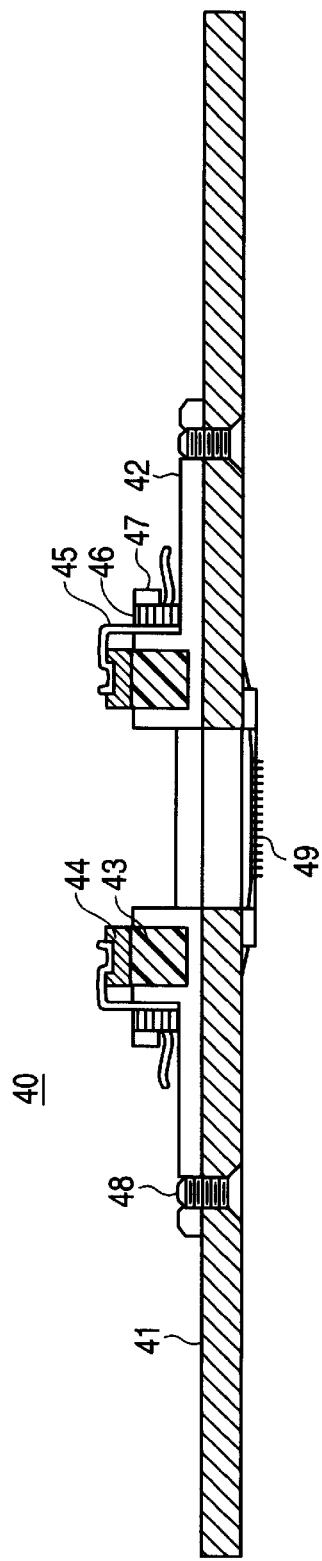

METHOD AND APPARATUS FOR SCRUBBING THE BOND PADS OF AN INTEGRATED CIRCUIT DURING WAFER SORT

This is a divisional of application application Ser. No: 08/590,542, filed Jan. 24, 1996, now abandoned.

FIELD OF THE INVENTION

The present invention relates to the field of semiconductor testing equipment and, more specifically, to the field of probe cards and probers for semiconductor test systems.

BACKGROUND OF THE INVENTION

In the manufacture of semiconductor devices it is advisable that such components be tested at the wafer level to evaluate their functionality. The process in which die on a wafer are tested is commonly referred to as "wafer sort." Testing and determining design flaws at the die level offers several advantages. First, it allows designers to evaluate the functionality of new devices during development. Increasing packaging costs also make wafer sorting a viable cost saver, in that the reliability of each die on a wafer may be tested before incurring the high costs of packaging.

Wafer sorting typically involves the use of probing technology wherein a probe card containing probe features engages the bond pads on a die so as to connect the pads to a tester. FIGS. 1A, 1B and 1C illustrates a typical testing apparatus including a tester 10, test head 11, and handler 12, that is used to test the performance of a die on a wafer. As illustrated, probe card 14 sits below and in contact with test head 1 1. During testing, the handler supports the wafer on platform (chuck) 16 and positions the wafer so as to precisely align the bond pads of a die to be tested with the probe features on the probe card. Chuck 16 is connected to a staging device 18 by rods 17. The staging device 18 typically positions the chuck along an x-y plane by moving along a stage floor 13 on a ball screw stage assembly. Staging device 18 may also position the chuck by floating above the stage floor on a magnetic air bearing. Chuck 16 typically comprises a vacuum chuck wherein the wafer being tested is held in position by drawing a vacuum within a plurality of interconnecting channels 19 that are formed within the surface of the chuck. Once aligned, chuck 16 is raised via rods 17 such that the bond pads of the die are forced against the probe features on the probe card.

All categories of probing utilize some form of "scrub" at the touch down phase of a probe feature to a bond pad. Scrub applies to probed aluminum or lead, where the probe features on a probe card pierce (scrub) the layer of oxide, a nonconductive film that grows quickly on exposed aluminum and lead. Generally, scrub applies to any nonconductive layer that produces a barrier between the test probes of a probe card and the base metal of a bond pad. The purpose of the scrub is to break through the non-conductive layer on the bond pads in order to establish a good electrical contact between the probe features and the base metal of the bond pads. Scrub occurs when the handler forces the wafer, and, subsequently, the bond pads of a die, against the probe features on the probe card causing the probe features to deflect. The scrub is generated by a small horizontal movement of each probe feature across the surface of each corresponding bond pad as the probe features deflect. As the probe features move across the bond pads they penetrate the nonconductive oxide layer thereby establishing a good electrical contact between the probe features and the bond pads. This type of scrub is referred to as "passive" scrub. Typically, the amount of deflection of the probe features, and, hence, the amount of scrub achieved, is proportional to the force applied by the movement of the wafer against the probe card features. The additional movement of a wafer toward a probe card after initial contact with a probe feature is known as "overdrive."

Probe cards presently available are of the passive scrub type. The cantilever tungsten needle probe card 20, as illustrated in FIG. 2, is one example. As shown in FIG. 2, probe card 20 possesses a fiberglass epoxy-base printed circuit board 21 with tungsten needles 22 extending out from the probe card and held in position by an epoxy ring 28. Each needle contains a tip (probe feature) 23 for making contact with the bond pads of a die. As previously discussed, the amount of scrub achieved on the surface of a bond pad is proportional to the force applied by the movement of the wafer against the probe card features. A tungsten needle probe card, as illustrated in FIG. 2, typically requires overdrive levels of 0.002 to 0.004 inches to achieve good electrical contact at the bond pads.

There are a number of problems associated with the passive scrub cantilever needle probe card. First, the high overdrive levels required to achieve good electrical contact between the probe features and die bond pads cause the probe features to bend, break and wear more quickly, resulting in increased replacement and repair costs. High overdrive also increases the probability that deep and damaging scrub marks will result making it difficult to bond wires to the die pad. Another problem associated with passive scrub cantilever needle probe card is that it sometimes requires two or more touchdowns per die test to break through the pad oxidation layer. This creates two problems. First, it prolongs the amount of time required to perform a die test. Secondly, it diminishes the effective life of a probe card.

Yet another problem with passive scrub needle cards is that stray particle and oxide buildup often occur at the tip of the probe features. Stray particle and oxide buildup contributes to high contact resistance between the probe feature and bond pad. High contact resistance causes inaccurate voltage levels during device testing due to the voltage produced across the probe tip. This may cause a device to incorrectly fail test resulting in lower test yields.

Membrane probe cards were developed to address some of the problems associated with tungsten needle probe cards. Namely, membrane probe cards were developed to provide a smaller and more uniform scrub along the bond pad surface. FIGS. 3A and 3B illustrate a cross-sectional view of a typical membrane probe card. As shown, probe card 30 possesses a flexible printed circuit (membrane) 31 having spherical contact bumps (probe features) 32. The contact bumps are generally coupled to an epoxy-base printed circuit board 34 that provides structural support for membrane 31 and electrically connects probe card 30 to the test head of a wafer sort tester. Photolithography is used to manufacture contact bumps 32, hence, the probe feature geometries that are achieved are small and precise. Column spring 33 provides both support and resilience to the membrane structure. The spring constant of column spring 33 establishes the amount of force that is required to deflect membrane 31 in order to achieve scrub at the contact bump and die pad interface.

Although smaller and more precise scrub geometries are achievable using membrane type probe cards, there exists two major draw backs associated with their use. First, the amount of scrub that is actually obtained is typically minimal or non-existent. That is, the probe features are often unable to pierce the oxidation layer of the die pad unless the die pad is very clean. Secondly, membrane probe features 32 are prone to clogging and must be cleaned on a relatively frequent basis. Because it is difficult to clean the membrane features without damaging them, the useful life of a membrane probe card is typically much shorter than that of a cantilever needle probe card. For these reasons, the use of membrane probe cards are generally avoided in full-scale manufacturing applications.

Thus, what is needed is a method and apparatus for electrically testing the functionality of wafers that solves the problems associated with current passive scrub techniques.

SUMMARY OF THE INVENTION

The present invention is an improved apparatus and method for establishing an electrical connection between the bond pads of an integrated circuit and the test probes of a probe card. In one embodiment an actuator assembly is attached to a standard cantilever needle probe card. The actuator assembly includes a base that is attached to the center of the probe card printed circuit board. Disposed within the base are two piezoelectric actuators disposed along opposite sides of the base. The actuators are secured in position by a spring, retainer and fastening device. A weight is disposed atop each actuator to control the frequency and amplitude of movement generated by the devices. In accordance with the present invention, an electrical connection is established between the test probes of the probe card and the bond pads of the integrated circuit by first placing the bond pads in intimate contact with the test probes. In order to penetrate the oxidation layer that exists along the surface of the bond pads, the piezoelectric actuators are then used to create a controlled movement between the test probes and the bond pads. Hence, the present invention utilizes an "active" scrub method for establishing a electrical connection between the test probes of a probe card and the bond pads of an integrated circuit.

In another embodiment, an actuator assembly is attached to a membrane probe card. The actuator assembly includes a base, a spring, a piezoelectric actuator and an actuation link that connects the assembly to the probe card column spring. Scrub is achieved by placing the membrane probe bumps in contact with their respective bond pads along the surface of an integrated circuit and activating the piezoelectric actuator to provide a side ways movement of the probe bumps relative to the bond pads.

In another embodiment of the present invention, an actuator assembly is attached to the chuck of a handler to provide a relative motion between the bond pads of an integrated circuit and the probe features of a probe card during scrub. In one particular embodiment, the actuator assembly is attached to the chuck by a collar and clamping apparatus.

In yet another embodiment of the present invention, the handler is equipped with a base that is coupled to a chuck via a mounting dish and plurality of pivot leaf springs. An actuator assembly is attached between the mounting dish and base to provide a relative movement between the chuck and base. Scrub is achieved by engaging the probe features of a probe card against the bond pads of an integrated circuit being held within the chuck and activating the piezoelectric actuator.

BRIEF DESCRIPTION OF THE DRAWINGS

The present invention is illustrated by way of example and is not limited by the figures of the accompanying drawings, in which like references indicate similar elements, and in which:

FIG. 1A illustrates a typical prior art tester, test head and handler.

FIG. 2 illustrates a typical prior art cantilever needle probe card.

FIG. 4A illustrates a one embodiment of the present invention having an actuator assembly attached to a cantilever needle probe card.

FIG. 4B illustrates a top view of the actuator assembly depicted in FIG. 4B.

DETAILED DESCRIPTION

Figure 1C:
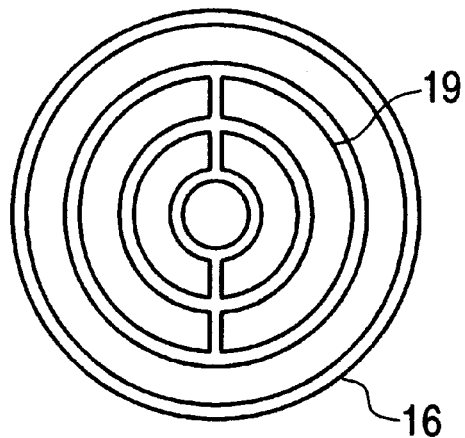
FIG. 1C illustrates a top view of the vacuum chuck depicted in FIG. 1B.
Figure 1B:
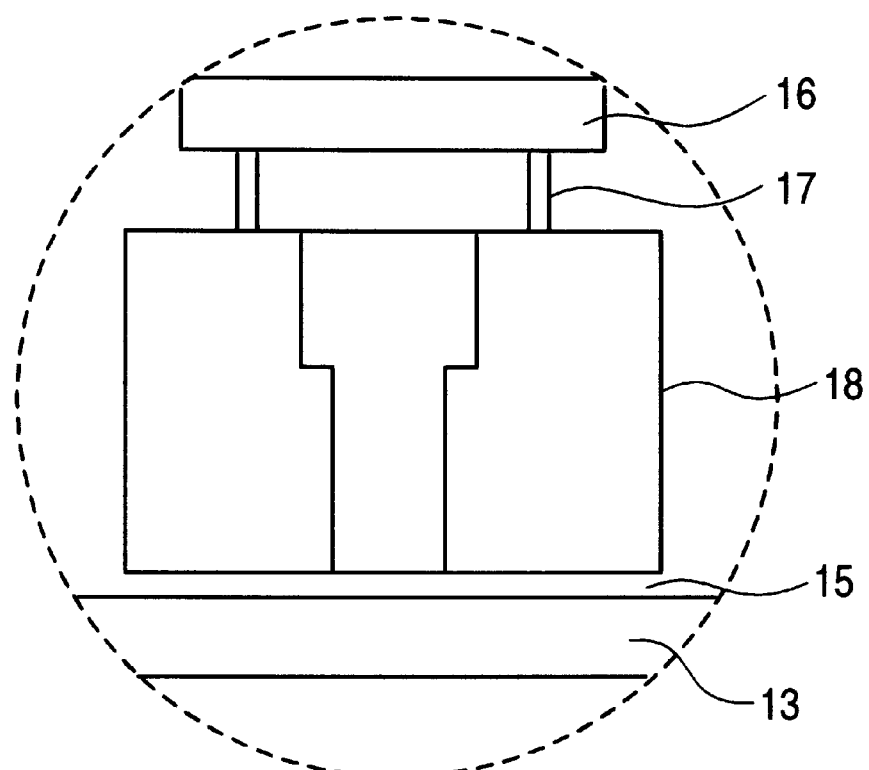
FIG. 1B illustrates a side view of the handler depicted in FIG. 1A.
Figure 3A:
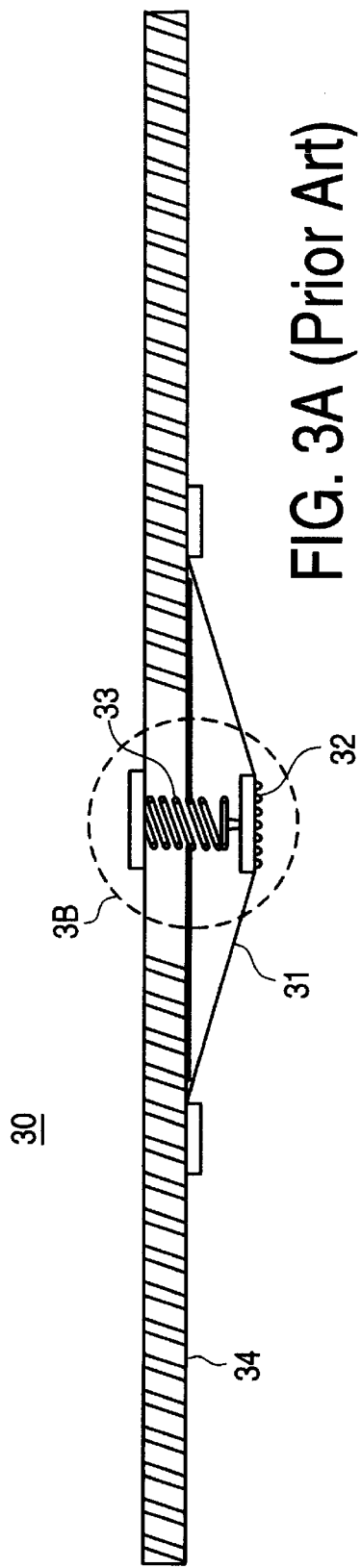
FIG. 3A illustrates a typical prior art membrane probe card.
Figure 3B:
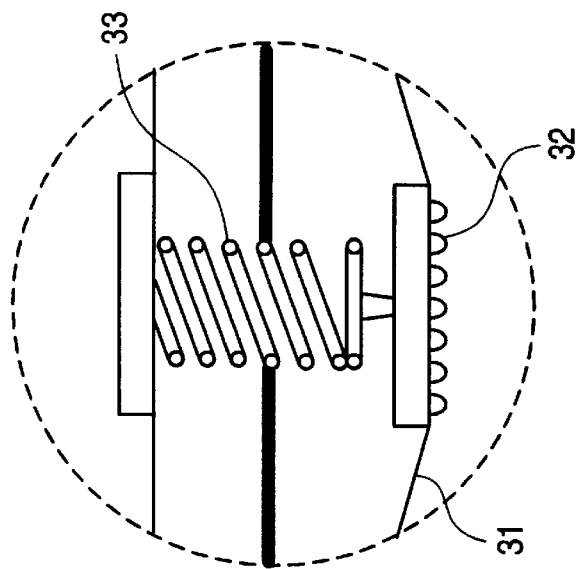
FIG. 3B illustrates a enlarged view of the membrane, probe features and spring of the probe card depicted in FIG. 3A.

An apparatus and method that provides an improved electrical connection between the test probes of a probe card and the bond pads of an integrated circuit is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

FIG. 4A illustrates an active scrub probe card 40 of one embodiment of the present invention. As shown, probe card 40 includes a standard cantilever needle probe array 49 that is attached to a printed circuit board (PCB) 41. Attached to PCB 41 is an actuator assembly comprising a base 42, piezoelectric actuators 43, weights 44, springs 45, retainers 46 and fasteners 47. The actuator assembly is attached to PCB 41 by threaded fasteners 48. A salient feature of the present invention lies in the manner in which scrub achieved.

As previously discussed, there are a number of problems associated with the use of passive scrub is devices. The present invention addresses these problems by providing an actuator assembly that is capable of creating a small, precise, variable and electrically-actuated movement between the test probes of a probe card and the bond pads of an integrated circuit. In accordance with the present invention, a reliable electrical contact is established between the test probes of a probe card and the bond pads of an integrated circuit by first placing the test probes and bond pads in intimate contact. Once the test probes and bond pads make contact, a controlled cyclic movement is applied to the test probes such that the test probes penetrate the oxidation layer on the bond pad surface.

Referring again to FIG. 4A, an actuator assembly is shown wherein piezoelectric actuators 43 and springs 45 are provided to produce an oscillating or cyclic movement to the cantilever needle probe array 49 when a voltage is applied to actuators 43. The frequency and amplitude of the cyclic movement produced by the piezoelectric actuators 43 is controlled, in part, by weights 44 that are attached atop the piezoelectric actuators. In the embodiment of FIG. 4A, the actuator assembly produces an upward and downward movement of test probes 49 causing the test probes to deflect against the bond pads of the integrated circuit (not shown) in a repetitive and rapid fashion. The depth, length and continuity of the scrub mark produced along the bond pad surface is determined by the frequency, amplitude and duration of the movement induced by the actuator assembly in conjunction with the scrub geometry and the amount of overdrive. It is appreciated that a number of variables determine the frequency and amplitude of the induced movement. These include: the size and type of piezoelectric actuators 43, the mass of weights 44, the flexibility of PCB 41, the voltage applied to piezoelectric actuators 43, the spring constant of springs 45, etc.. By precisely controlling the frequency, amplitude, time of scrub and the duration of the movement induced by the actuator assembly, a number of advantages may be realized using the active scrub method of the present invention. For example, lower overdrive levels may be used resulting in a longer probe card life. The active scrub method also provides an inherent cleaning method that limits the stray particle and oxide buildup that often occurs at the test probe tip. By periodically activating the piezoelectric devices between scrubbing events, a test probe "cleaning" mode may be established that effectively minimizes the stray particle and oxide buildup at the test probe tip. A special cleaning surface may also be used to implement a special test probe "cleaning" mode. The present invention also offers the opportunity to develop specialized software "recipes" (specific combinations of variable settings) for different integrated circuit designs and manufacturing processes. In this manner, the present invention may accommodate bond pad and oxidation layer variations while optimizing the wafer sort process.

As illustrated in FIG. 4A, actuators 43 are disposed within a base 42 that is attached to a standard cantilever needle probe card. Actuators 43 may comprise any of a variety of piezoelectric actuators, such as, for example, the NEC brand multilayer, AE series, piezoelectric actuators. Actuators 43 are typically attached to base 42 by an epoxy resin adhesive. It is appreciated, however, that any of a number of other attachment methods may be used. For example, a clamping device may be used in lieu of an adhesive. Base 42 comprises a material that possesses a coefficient of thermal expansion that is substantially similar to expansion coefficient of actuators 43. In one embodiment, base 42 comprises Invar, a high temperature nickel alloy. Similarly, weights 44 typically comprises a material having a coefficient of thermal expansion that is substantially similar to that of actuators 43. The mass of weights 44 may vary depending upon the particular scrub requirements. The weights are secured to actuators 43 by an adhesive. It is understood, however, that a variety of other attachment methods may also be used. Springs 45 provide a given resistance to the upward and downward movement of actuators 43. Springs 45 act in combination with weights 44 to control the frequency and amplitude of the movement produced by actuators 43. Retainers 46 and fasteners 47 comprise stainless steel and are provided to secure the springs to the actuator assembly.

FIG. 4B illustrates a top view of the embodiment depicted in FIG. 4A. As shown, actuators 43 comprise electrical wires 51 for connecting the actuators to a voltage source. Power may be supplied to actuators 43 by a constant or variable voltage source. Also note, that through holes 50 are provided within base 42 to accommodate fasteners 48 that are used to attach the actuator assembly to PCB 41.

In one embodiment, the present invention is implemented by bringing the bond pads of an integrated circuit in contact with the test probes 49 of probe card 40. Once the bond pads (not shown) and test probes are in intimate contact, a controlled cyclic movement of the test probes is produced by providing a voltage to actuators 43. The actuation frequency of test probes 49 is generally held between 100 to 1000 Hertz. The duration of the scrub is typically between 0.3 to 1.0 seconds.

Although an actuator assembly comprising two piezoelectric actuators has been described in the embodiment of FIG. 4A, it is appreciated that any of a number of types of actuators may be used in the implementation of the present invention. In addition, it is understood that the implementation of the present invention is not limited to the use of piezoelectric actuators. Other actuation means, such as ultra sound and voice coils, may be used to implement the invention. Moreover, it is appreciated that the actuator assembly described in the embodiment of FIG. 4A is not limited to a cantilever needle probe card but may also be used in conjunction with a membrane probe card.

Figure 5A:
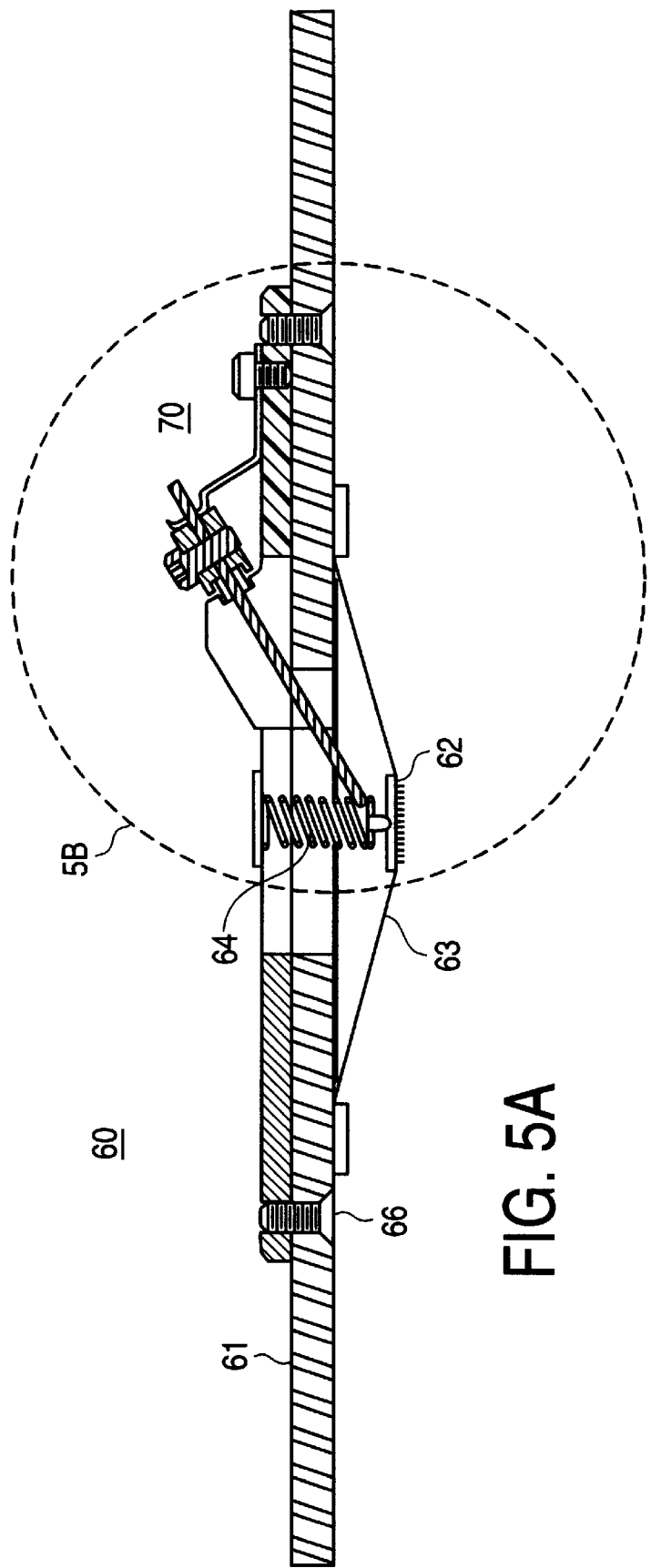
FIG. 5A illustrates a another embodiment of the present invention having an actuator assembly attached to a membrane probe card.
Figure 5B:
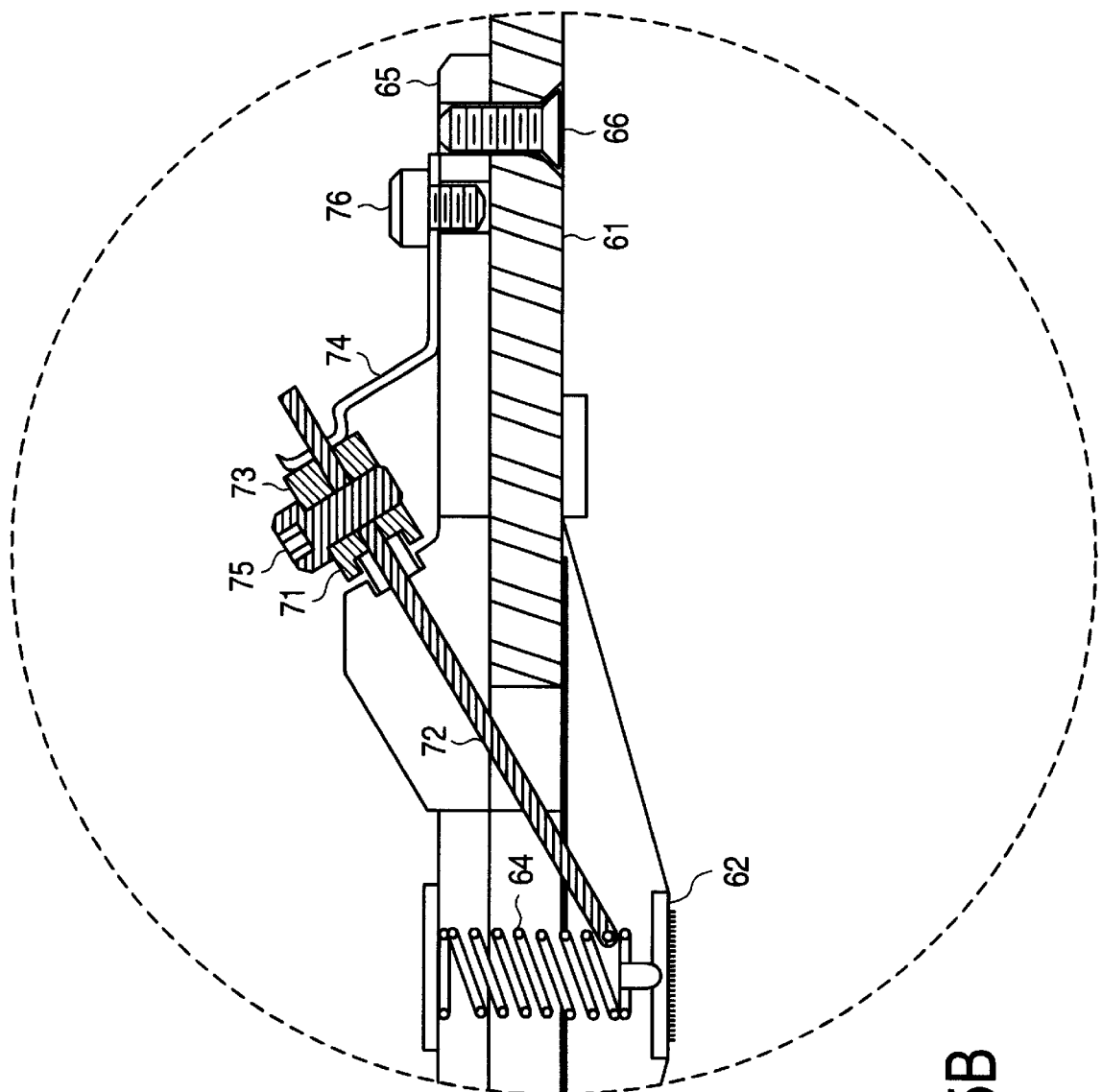
FIG. 5B illustrates an enlarged view of the actuator assembly shown in FIG. 5A.

FIG. 5A illustrates an active scrub probe card 60 of another embodiment of the present invention. As shown, probe card 60 includes a membrane style probe card having probe bumps 62 disposed along the bottom surface of membrane 63 that is supported by a column spring 64. Attached to PCB 61 is an actuator assembly 70. As illustrated in FIG. 5B, actuator assembly 70 includes a base 65, a spring 74, a piezoelectric actuator 71 and an actuation link 72 that connects the assembly to the probe card column spring 64. An actuator bridge plate 73 and a support screw 75 is used to secure actuator 71 and spring 74 to actuation link 72. Spring 74 is attached to base 65 with threaded fastener 76. The actuator assembly base 65 is attached to PCB 61 via flat head threaded fasteners 66. Although a single actuator assembly has been described, it is should be noted that two or more actuator assemblies may be used in the implementation of the invention.

As previously discussed, current passive scrub type membrane probe cards are generally avoided in full-scale manufacturing applications because of their inability to penetrate the bond pad oxidation layer in a repeatable and reliable fashion. The probe bumps (test probes) of a membrane card are also prone to clogging. The present invention addresses these problems by providing an actuator assembly 70 that enables the membrane test bumps 62 to penetrate the oxidation layer on a bond pad in a reliable and repeatable manner. In accordance with the present invention, scrub is achieved by placing the membrane probe bumps 62 in contact with their respective bond pads along the surface of an integrated circuit and activating the piezoelectric actuator 71 to provide a controlled side ways movement of probe bumps 62 relative to the bond pads. The depth, length and continuity of the scrub mark produced along the bond pad surface is largely determined by the following factors: 1) the size and type of actuator 71; 2) the spring constant of springs 64 and 74; 3) the mass and geometric configuration of the actuator assembly support structure; and 4) the flexibility of membrane 62 and PCB 61. As an example, the actuation angle of actuation link 72 will affect the horizontal movement of membrane test probes 62. To address the problems associated with the clogging of probe bumps 62, a special cleaning mode may be implemented in a manner similar to that disclosed above in the description of the embodiment of FIG. 4A.

In one embodiment of the present invention, actuator 71 comprises a NEC brand, AE series, multilayer piezoelectric actuator. Actuator 71 is secured to actuation link 72 via a t-shape actuation bridge 73 that comprises Invar, a high temperature nickel alloy. Actuation link 72 typically comprises stainless steel whereas base 65 comprises a material that has a coefficient of thermal expansion that is substantially similar to that of PCB 61. In one embodiment, base 65 comprises Invar.

In the foregoing discussion, a cleaning mode has been described where the test probes of a probe card are cleaned by periodically activating the piezoelectric devices between scrubbing events. A special cleaning surface having a textured surface has also been described as a means to implement the cleaning mode. In one embodiment of the present invention a vibrating cleaning surface may be provided as an attachment to the handler or as a stand-alone unit. In this manner, the test probes of a probe card may be cleaned by bringing the test probes into contact with the cleaning surface and vibrating the cleaning surface in relation to the probe features. In one embodiment, the vibrating or oscillating movement of the cleaning surface is provided by a piezoelectric actuator.

Figure 6B:
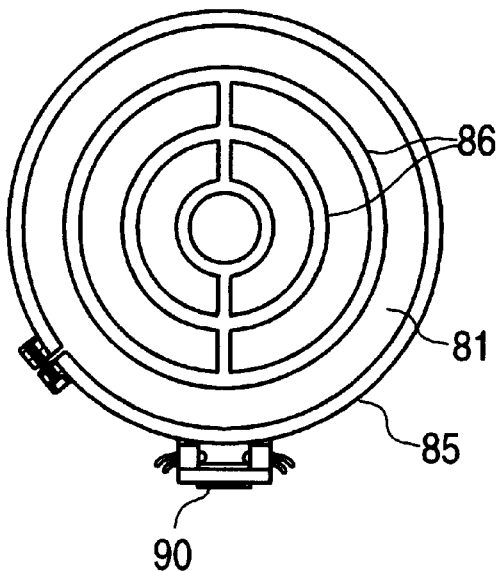
FIG. 6B illustrates a top view of the chuck assembly depicted in FIG. 6A.
Figure 6A:
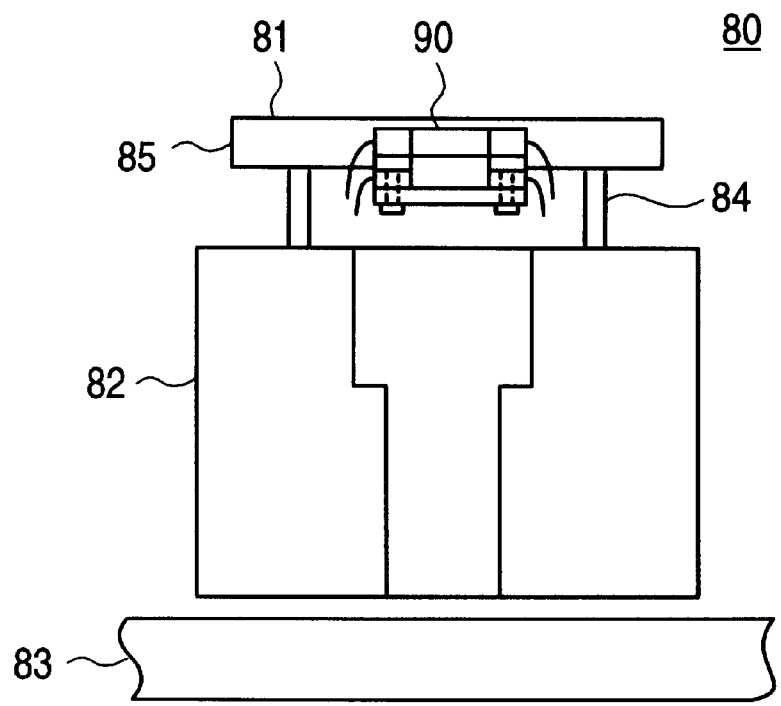
FIG. 6A illustrates yet another embodiment of the present invention having an actuator assembly attached to the vacuum chuck of a handler.

FIG. 6A illustrates yet another embodiment of the present invention wherein an actuator assembly 90 is attached to the chuck 81 of a handler assembly 80 to provide a relative motion between the bond pads of an integrated circuit and the test probes of a probe card during scrub. Note that in the embodiment of FIGS. 4A and 5A scrub is achieved by providing movement to the test probes relative to the bond pads on an integrated circuit. In the embodiment of FIG. 6A, scrub is achieved by providing a movement to the integrated circuit instead of the probe card features.

As shown, FIG. 6A illustrates a typical handler assembly 80. Assembly 80 includes a chuck 81 and a positioning stage 82 that rides along a stage floor 83 for positioning the chuck along an x-y direction. Rods 84 connect chuck 81 to the positioning stage and are used to raise the chuck, and consequently, the integrated circuit that rests on the chuck, up against the test probes of a probe card during a typical wafer sort process.

Figure 7A:
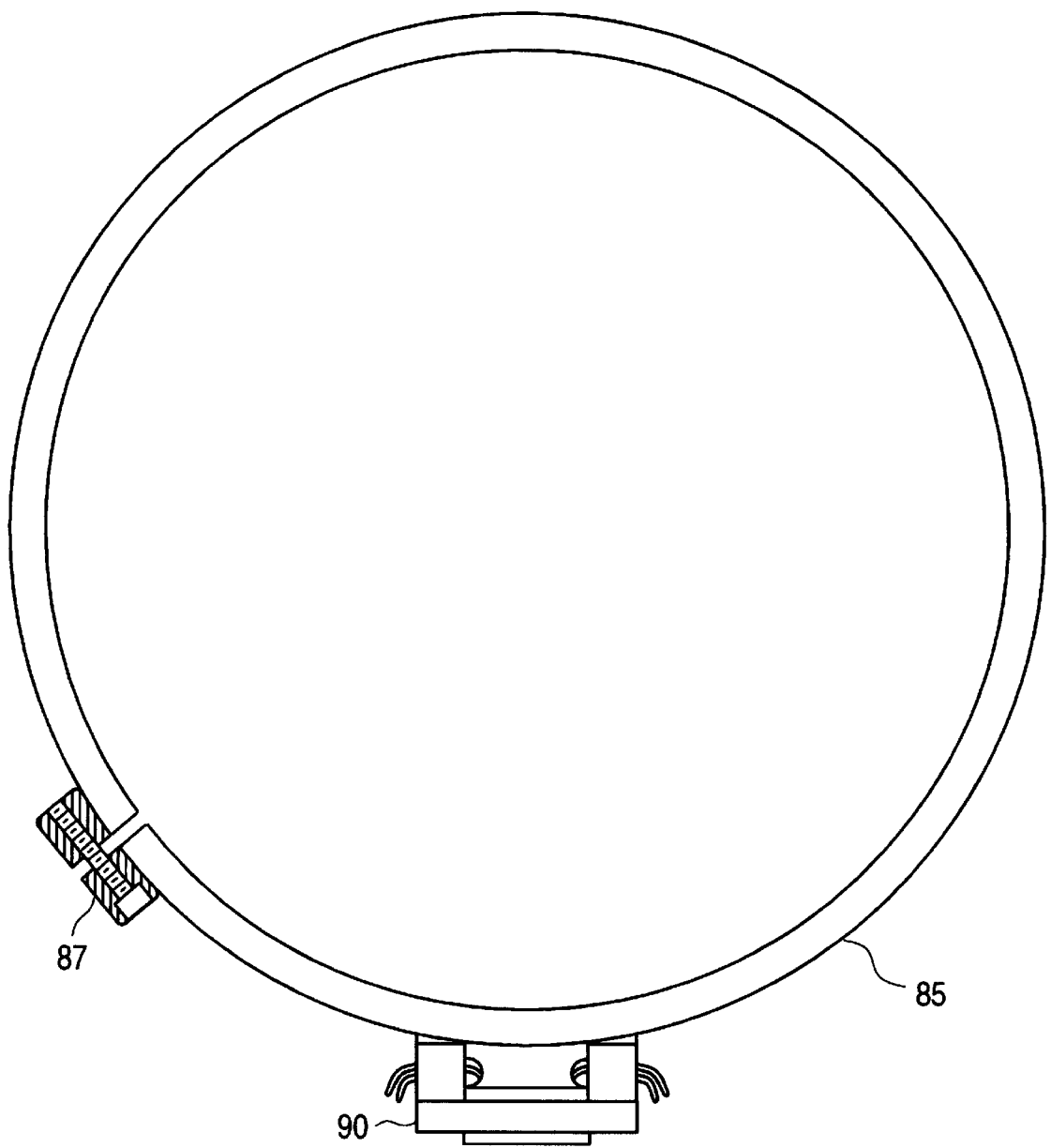
FIG. 7A illustrates one embodiment of the actuator mounting collar depicted in FIGS. 6A and 6B.

FIG. 6B illustrates a top view of the chuck and actuator assembly depicted in FIG. 6A. Chuck 81 typically comprises a vacuum chuck wherein the integrated circuit device being tested is held in position by drawing a vacuum within a plurality of interconnecting channels 86 formed within the surface of the chuck. Actuator assembly 90 is attached to chuck 81 by an actuator mounting collar 85 (See FIG. 7B). FIG. 7A illustrates a top view of the mounting collar assembly 85. Integrally formed within collar 85 is a mounting base 98 that supports the actuator assembly. Mounting collar 85 includes a clamp 87 for securing the collar to chuck 81.

Figure 7B:
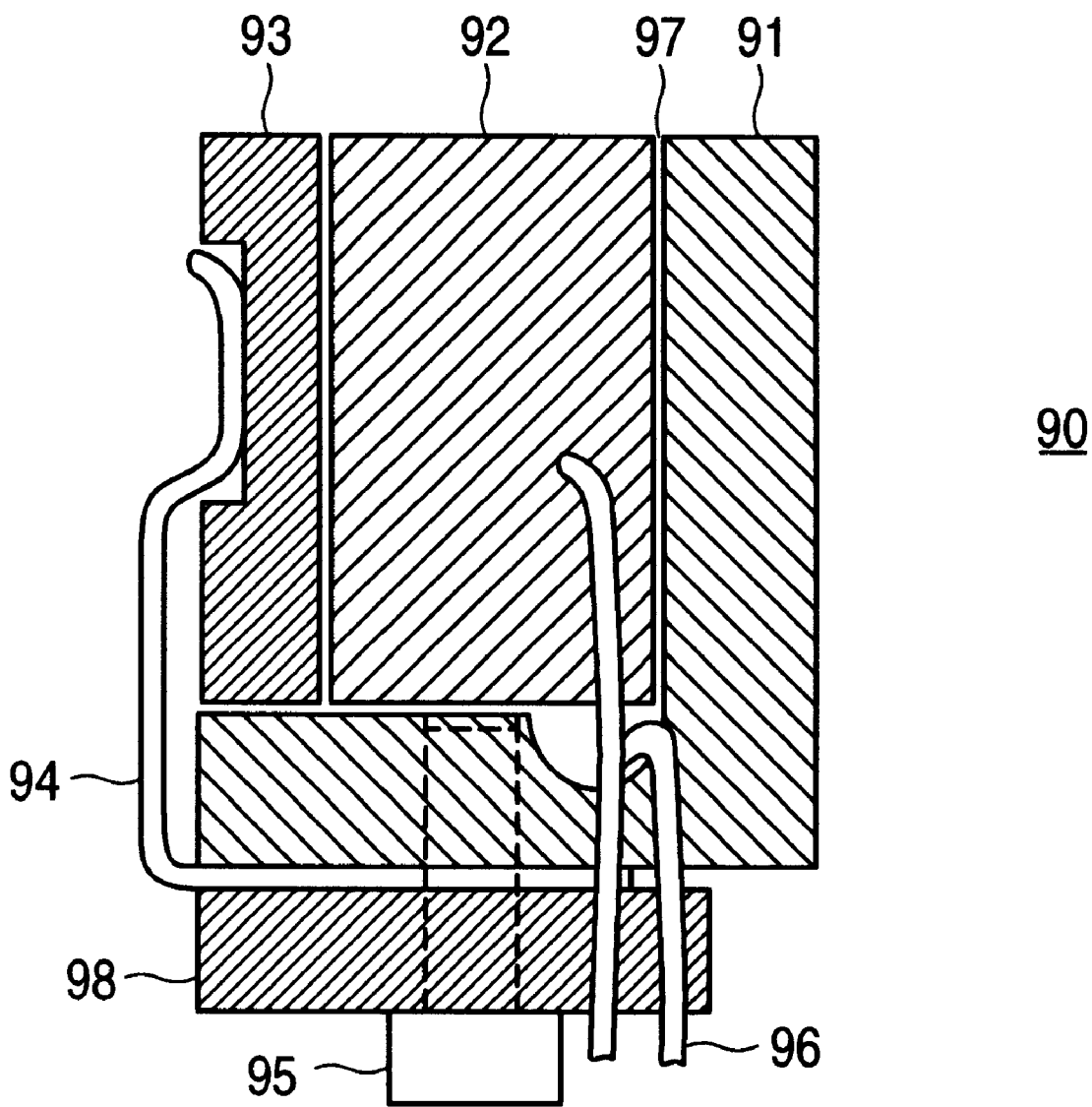
FIG. 7B illustrates a cross-sectional side view of the actuator assembly depicted in FIG. 7A.

Turning to FIG. 7B, a side view of actuator assembly 90 is shown. The assembly includes a piezoelectric actuator 92 that is secured between a base 91 and a weight 93. Spring 94 acts against weight 93 to provide a given resistance along one surface of the weight. Weight 93 and spring 94 act, in part, to control the frequency and amplitude of the movement produced by actuator 92. Actuator 92 is generally attached to base 91 and weight 93 by an adhesive 97, such as an epoxy resin. Weight 93 and base 91 comprise a material that has a coefficient of thermal expansion that is substantially similar to that of actuator 92. Actuator 92 possesses electrical wires 96 for coupling the actuator to a power source. The assembly base 91 is attached to actuator mounting collar 85 at the collar base 98. A threaded fastener 95 is used to connect the mounting collar base 98 to actuator base 91.

Figure 8B:
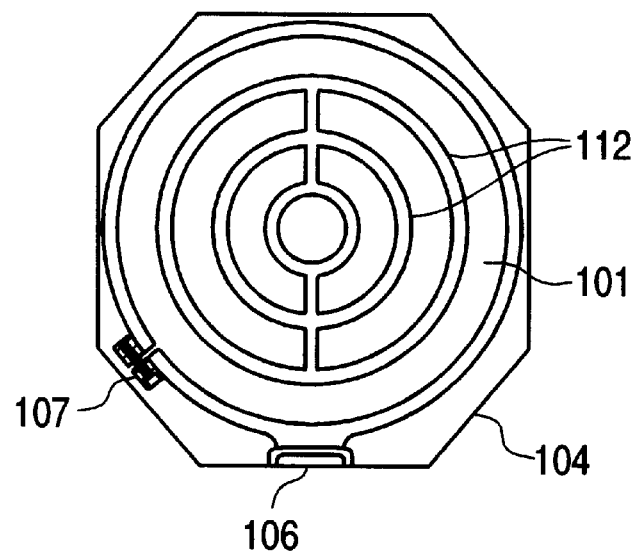
FIG. 8B illustrates a top view of the chuck, base and actuator assembly depicted in FIG. 8A.
Figure 8A:
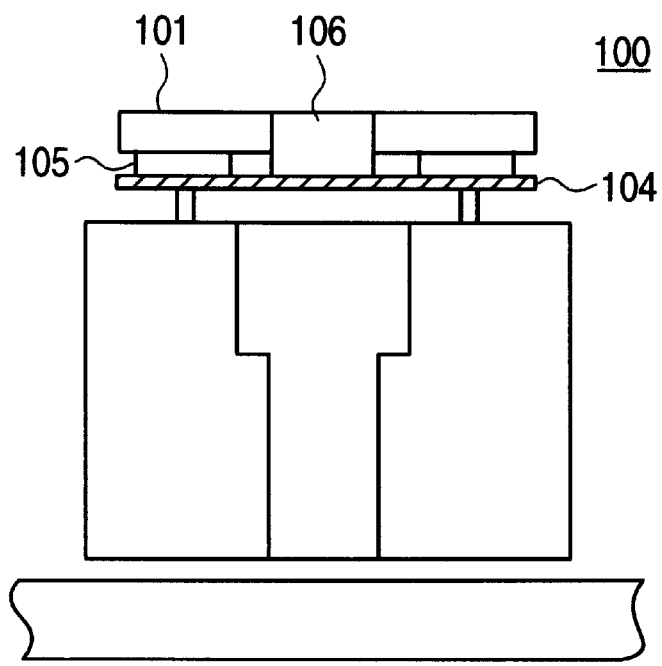
FIG. 8A illustrates another embodiment of the present invention.

FIG. 8A illustrates another embodiment of the present invention wherein the handler assembly 100 is equipped with a base 104 that is coupled to a chuck 101 via a plurality of pivot leaf springs 105 and an actuator assembly 106. Actuator assembly 106 is attached between a mounting dish and base to provide a relative movement between the chuck and base. Scrub is achieved by engaging the test probes of a probe card against the bond pads of an integrated circuit being held within chuck 101 and activating the piezoelectric actuator within assembly 106. In this manner, the bond pads of the integrated circuit are moved relative to the probe card test probes producing a controlled scrub of the oxidation layer on the surface of the bond pads.

FIG. 8B illustrates a top view of the chuck, base and actuator assembly of FIG. 8A. Chuck 101 typically comprises a vacuum chuck and includes a plurality of channels 112 disposed along its surface. As shown in FIGS. 8A and 8B, actuator assembly 106 is attached to chuck 101 and base 104. Note also, that a plurality of pivot leaf springs 105 mechanically couple chuck 101 to base 104. It is noted that a number of other biasing means may be used in lieu of springs 105. As illustrated, in one embodiment actuator assembly 106 is attached to chuck 101 via a mounting collar 107 similar to that described in the embodiment of FIG. 7A. Note however, that a mounting collar is not necessary to implement the present invention. It is appreciated that actuator assembly 106 may be attached to the base or chuck by any of a number of attachment methods commonly known in the art.

Figure 8C:
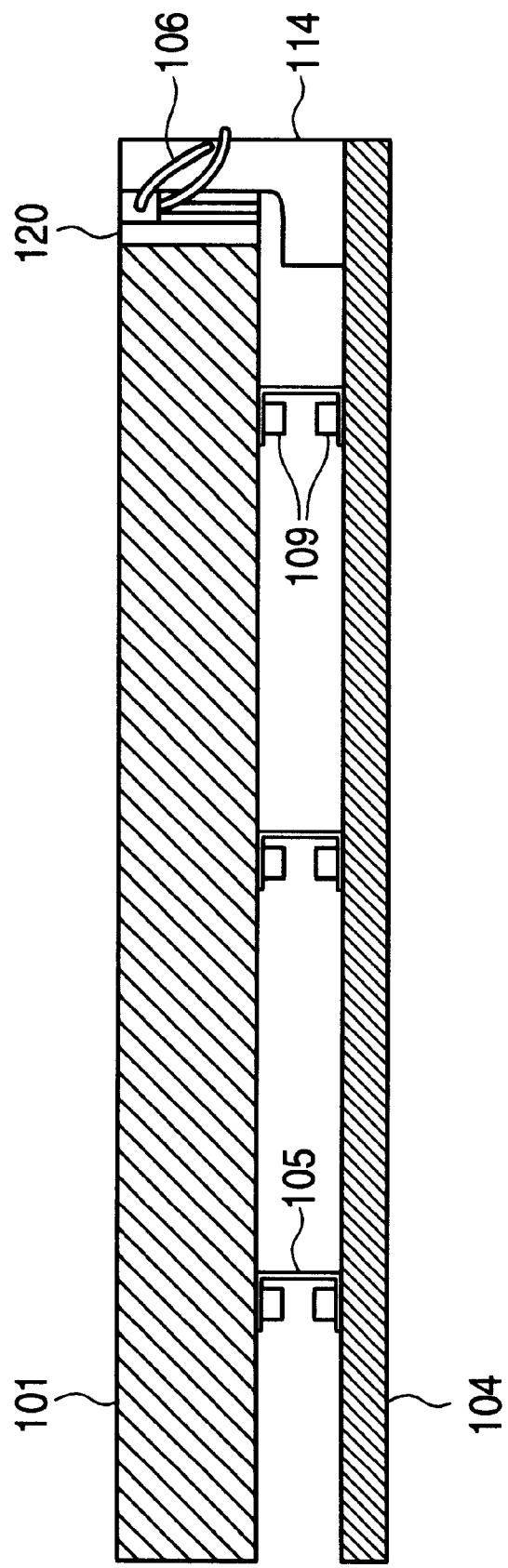
FIG. 8C depicts a side view of the chuck, actuator assembly and base in the embodiment illustrated in FIG. 8A.

FIG. 8C illustrates a side view of the chuck 101, base 104 and actuator assembly 106 of the present invention. As shown a piezoelectric actuator 120 is positioned between an actuator base 114 and chuck 101. The frequency of the movement created between chuck 101 and base 104 is controlled, in part, by pivot leaf springs 105. For example, the frequency of the movement between the two parts may be varied by increasing or decreasing the number of springs, changing the position of the springs or varying the flexibility (spring constant) of the springs. The amplitude of the induced oscillation is largely controlled by the actuator displacement and the geometry of the actuating structure. Other variables, such as the mass of base 114 and chuck 101, may also be adjusted to control the movement of chuck 101 relative to base 104 when actuator 120 is activated. In lieu of directly attaching pivot leaf springs 105 to chuck 101, the base 104 may be attached to a mounting dish or other platform structure that holds chuck 101.

In the foregoing discussion, cantilever needle probe cards and membrane probe cards have been described in the implementation of the present invention. It is to be understood, however, that the present invention is applicable to any of a number of other probe cards, including vertical and spring based probe cards. Moreover, practitioners in the art will appreciate that the scope of the present is not limited to probe cards but may used in conjunction with any structure containing test probes. It is further understood that the present invention is not limited to the scrubbing of oxidation layers on integrated circuit bond pads. The invention may be used in any application wherein the removal of an electrical insulator layer, or other non-conductive particles, is required to establish a good electrical connection between the probe features of a tester and the base metal of a bond pad.

Thus, an apparatus and method for providing an improved electrical connection between the test probes of a probe card and the bond pads of an integrated circuit is described. Although many alternations and modifications to the present invention will no doubt become apparent to the person of ordinary skill in the art after having read the foregoing description, it is to be understood that the particular embodiments shown and described by way of illustration are in no way intended to be limiting. It is further understood that the relative dimensions, geometric shapes, materials and process parameters set forth within the specification are exemplary of the disclosed embodiments only. Other embodiments may utilize different dimensions, shapes, materials, and process steps, etc., to achieve substantially the same results.

What is claimed is:

1. An improved method for electrically coupling the bond pads of an integrated circuit to a tester using a probe card having a plurality of test probes, said method comprising the steps of:

a) placing said integrated circuit on a holder of an assembly, wherein the assembly also includes a base connected to said holder by a piezoelectric actuator, and a positioning stage providing support for said base;

b) placing said test probes in contact with said bond pads of said integrated circuit; and c) enabling the piezoelectric actuator to provide a horizontal movement to said holder such that said holder moves said integrated circuit relative to said test probes, wherein in response to said horizontal movement said test probes pierce an electrical insulation layer on said bond pads to establish an electrical connection between said test probes and said bond pads.

2. An improved handler for positioning the bond pads of an integrated circuit in intimate contact with the test probes of a probe card, said handler comprising:

a platform having a top for holding said integrated circuit;

means for positioning said platform such that said test probes of said probe card make intimate contact with said bond pads;

an actuator coupled to said platform such that when the actuator is activated said integrated circuit moves horizontally relative to said test probes such that said test probes pierce an electrically non-conductive layer on said bond pads when said test probes and said bond pads make intimate contact.

3. The handler of claim 2 wherein said platform includes a vacuum chuck.

4. The handler of claim 2 wherein said actuator assembly includes a piezoelectric actuator.

5. A handler assembly for positioning bond pads of an integrated circuit in intimate contact with test probes of a probe card, said handler comprising:

a platform for holding said integrated circuit;

an actuator assembly connected to said platform;

a base connected to said actuator assembly;

a positioning stage coupled to said base, said positioning stage for positioning the platform in an X-Y plane such that when said platform is raised the bond pads make intimate contact with the test probes, wherein the actuator assembly is activated when the bond pads make intimate contact with the test probes such that the platform vibrates the integrated circuit relative to the base and independent of the positioning stage, and wherein the actuator assembly vibrates the platform in the X-Y plane.

6. The handler assembly of claim 5 further comprising a biasing element interposed between said platform and said base and cooperating with the actuator assembly to control the vibration of the platform relative to the base.

7. The handler assembly of claim 6 wherein the biasing element is a pivot leaf spring.

8. The handler assembly of claim 7 wherein the actuator assembly comprises a piezoelectric actuator.

9. The handler assembly of claim 7 further comprising a mounting dish interposed between the base and the platform.

10. The handler assembly of claim 5 further comprising a plurality of rods for coupling said positioning stage to said platform and for raising said platform.

* * * * *